United States Patent
Van Peursem et al.

(10) Patent No.: US 6,286,053 B1
(45) Date of Patent: Sep. 4, 2001

(54) METHOD, CLIENT DEVICE, SERVER AND ARTICLE OF MANUFACTURE FOR COMPRESSING UNIVERSAL RESOURCE INDICATORS USING PARTITIONED LEFT/RIGHT STRING SUBSTITUTION

(75) Inventors: James Edward Van Peursem, Hanover Park; Dale Robert Buchholz, Palatine, both of IL (US)

(73) Assignee: Motorola Inc., Scahumburg, IL (US)

(*) Notice: Subject to any disclaimer, the term of this patent is extended or adjusted under 35 U.S.C. 154(b) by 0 days.

(21) Appl. No.: 09/107,663

(22) Filed: Jun. 30, 1998

(51) Int. Cl.[7] ........................................ G06F 15/16
(52) U.S. Cl. ..................... 709/247; 707/101; 708/203
(58) Field of Search ........................ 709/247; 707/101; 708/203

(56) References Cited

U.S. PATENT DOCUMENTS 5,511,159 * 4/1996 Baket et al. ......................... 707/540
5,956,490 * 9/1999 Buchholtz et al. .................. 709/247

* cited by examiner

*Primary Examiner*—Zarni Maung
*Assistant Examiner*—Saleh Najjar
(74) *Attorney, Agent, or Firm*—Douglas D. Fekete (57) ABSTRACT

The present invention includes a method (700, 800, 900, 1200), client device (700, 800, 1000), server (900, 1100) and article of manufacture (700, 800, 900, 1000, 1100) for compressing/decompressing a current universal resource identifier URI using an immediately previous URI. The method for compressing the URI includes the steps of: partitioning the immediately previous URI and the current URI into a predetermined number of components; and comparing each component of the current URI with each corresponding component of the immediately previous URI from left-to-right LR and from right-to-left RL and encoding the current URI using concatenated compression indicators in accordance with counts of LR-matched characters, RL matched characters and uncompressed characters, wherein an escape byte is added to an end of the uncompressed characters when a last uncompressed character has a most significant bit set to one.

16 Claims, 6 Drawing Sheets

METHOD, CLIENT DEVICE, SERVER AND ARTICLE OF MANUFACTURE FOR COMPRESSING UNIVERSAL RESOURCE INDICATORS USING PARTITIONED LEFT/RIGHT STRING SUBSTITUTION

RELATED APPLICATIONS

The present application is related to the following application which is incorporated herein by reference: patent application Ser. No. 09/107,874, METHOD, CLIENT DEVICE, SERVER AND ARTICLE OF MANUFACTURE FOR COMPRESSING UNIVERSAL RESOURCE INDICATORS USING LEFT/RIGHT STRING SUBSTITUTION by Dale Robert Buchholz and James Edward Van Peursem, which is being filed concurrently and which is assigned to Motorola, Inc.

FIELD OF THE INVENTION

The present invention relates to universal resource indicators, and more particularly to compression of universal resource indicators.

BACKGROUND OF THE INVENTION

URLs or web addresses with respect to the Internet are known. As far as the HyperText Transport Protocol (HTTP) is concerned, these are Uniform Resource Identifiers (URIs) which include universal resource locators and/or universal resource names, i.e., formatted strings that identify a network resource by name, location or another predetermined characteristic. URIs throughout the rest of the text include universal resource identifiers, universal resource locators and universal resource names.

The compression of URIs in HTTP requests can provide throughput benefits by reducing the number of bytes that need to be transmitted. In any network where the uplink is shared and a contention-based access scheme is used to arbitrate transmissions, reducing the transmitted packet size makes it less likely to collide with another transmission. This is true of all variety of wireless networks, including wide-area packet data (e.g., Cellular Digital Packet Data (CDPD)), two-way paging (e.g., ReFLEX), and wireless LANs (RF and IR), as well as wired networks that provide wide-area data services, such as those emerging in the cable television industry. The URI is often a large part of the request.

Therefore, since compressing the URI may substantially reduce the probability for collision in the uplink or may provide better efficiency in bandwidth-constrained uplinks, there is a need for an efficient scheme for compressing URIs.

DETAILED DESCRIPTION OF A PREFERRED EMBODIMENT

With respect to HyperText Transport Protocol (HTTP), Universal Resource Identifiers (URIs) or web addresses are formatted strings which identify a network resource via name, location, or any other characteristic.

The compression of URIs in HTTP requests can provide throughput benefits by reducing the number of bytes that need to be transmitted. In any network where the uplink is shared and a contention-based access scheme is used to arbitrate transmissions, reducing the transmitted packet size makes it less likely to collide with another transmission. This is true of all variety of wireless networks, including wide-area packet data (e.g., CDPD), two-way paging (e.g., ReFLEX), and wireless LANs (RF and IR), as well as wired networks that provide wide-area data services, such as those emerging in the cable television industry. The URI is often a large part of the request. Therefore, compressing the URI may substantially reduce the probability for collision in the uplink or may provide better efficiency in bandwidth-constrained uplinks.

The technique of partitioned left/right string substitution (P-LRSS) is a variant of the left/right string substitution (LRSS) described in CR00147M. LRSS treats the entire URI as a single entity. The string matching and substitution is performed only once from the left and once from the right. This a very straightforward, yet efficient method. As such, LRSS provides a baseline in terms of memory usage, processing time, and compression ratio.

However, in using the LRSS technique, some character strings in URIs may not be compressed due to the manner in which LRSS performs its left and right string matching and substitution. Greater compression may be achieved if the URI is partitioned into several components instead of treating the URI as a whole. The typical impact is added complexity in terms of memory management and slightly greater processing that yields better compression results.

The following example is a URI used to request an Infoseek search for information using the keywords Outboard and Motors. The URI is as follows:

http://guide-p.infoseek.com/WW/NS/ Titles?qt= Outboard+Motors&col=WW

Partitioning the URI into its components, as defined in RFC 1630 and RFC 1738, yields the following:

| scheme: | http: |
|---|---|
| network host: | //guide-p.infoseek.com |
| absolute path: | /WW/NS/ |
| file name: | Titles |
| user query: | ?qt=Outboard+Motors&col=WW |

The http: scheme is the Internet protocol used in the information exchange. Other schemes include ftp, gopher, wais, email, and network news. The network host is the legal Internet host domain name or IP address of the server for the request. The absolute path is the path through the file system on the network host that gets to the directory where the desired file is located. The file name is the name of a data file or executable program. The user query is a conveyance to the server of the information collected at the client.

The compression scheme of the present invention erforms left and right string matching and substitution separately on each of the partitioned components of the URI. For example, in the above URI, there are five partitioned components. The five partitioned components from the immediately previous URI in the request stream associated with an individual client are compared to the five components of the current URI received from the same client. The compression scheme is carried out as follows:

If the previous URI is empty, then no compression is possible;
Save current as previous for next comparison.
Else,
Partition the URI into its components.
Initialize a structure indicator for the current URI.
For each component (i.e., scheme, network host, absolute path, file name, and user query), repeat the following steps:
Compare the component from the current URI with the corresponding component from the previous URI from left-to-right (LR);
Determine the number of matching characters and encode an LR count;
Compare the component from the current URI with the corresponding component from the previous URI from right-to-left (RL);
Determine the number of matching characters and encode an RL count;
Update the structure indicator;
Concatenate the encoded LR count, the RL count and the remaining characters that did not match from either direction.
Save the partitioned current as the partitioned previous for the next comparison.

Figure 1:
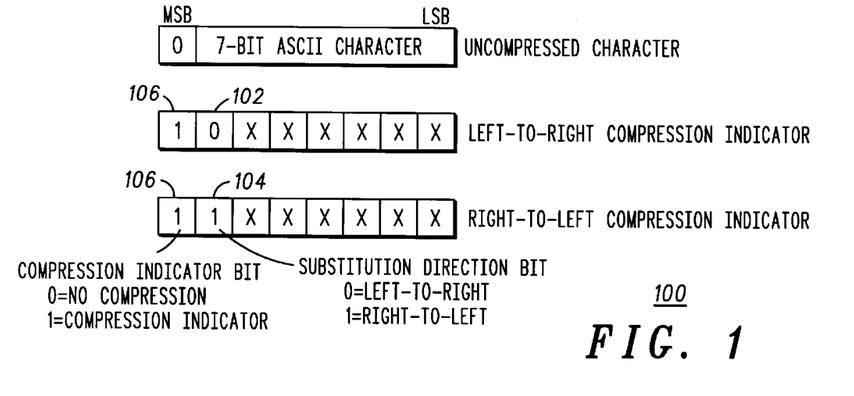
FIG. 1 illustrates the format of a compression indicator in accordance with the present invention.
Figure 4:
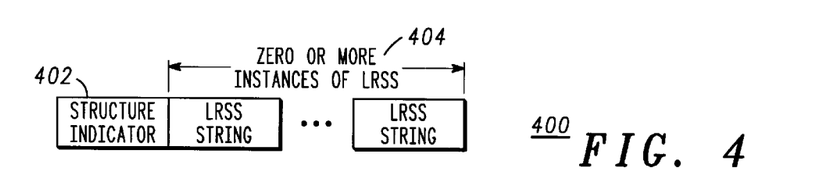
FIG. 4 is a block diagram showing the general structure of partitioned left-right string substitution for a compressed URI in accordance with the present invention.

The general structure of a P-LRSS compressed URI is shown in FIG. 4, numeral 400. A byte designating a compressed URI and its structure (structure indicator byte; 402) is followed by zero or more instances of LRSS-compressed strings (404). An LRSS-compressed string is the result of compressing a part of the URI, e.g., network host. The detailed format of these LRSS strings is described in CR00147M. Briefly, an LRSS string consists of a left-to-right compression indicator followed by a right-to-left compression indicator followed by a set of uncompressed characters. The format of the compression indicator (106) is shown in FIG. 1, numeral 100. That is, when compression is used, the compression indicator bit is typically set to 1 (one) (106), and where there is no compression, the compression indicator bit is typically set to 0 (zero) representing an uncompressed character. Another bit is used to distinguish left-to-right from right-to-left. The msb-1 is typically set to 0 (zero) (102) to mark left-to-right and set to 1 (one) (104) to mark right-to-left. The remaining six bits are used to encode the respective counts.

Figure 2:
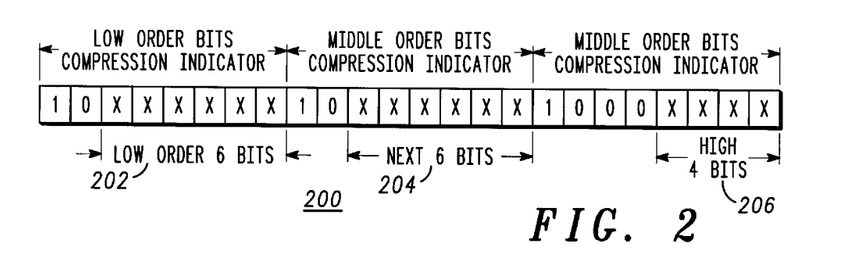
FIG. 2 illustrates an example of the construction of a left-to-right compression indicator for unsigned integers in accordance with the present invention.

As set forth above, compression indicators may vary in length depending on the size of the count to be encoded. FIG. 2, numeral 200, illustrates the construction of an example of a left-to-right compression indicator for the unsigned integers in the range 8,192–65,535 (requires 13–16 bits) in accordance with the present invention. Compression indicator bytes are chained together. Each byte contains 6 bits of the unsigned integer to be encoded. The same chaining principle applies to left-to-right and right-to-left compression indicators. This is an efficient mechanism for encoding counts of varying sizes and is not limited to the 16 bits (6 low order bits (202), a next 6 bits (204) and 4 high order bits (206)) shown in this example.

Of particular interest in P-LRSS is the case where the component of the URI being compressed is an exact match of the same component from the previous URI. In this case, a bit is set in the structure indicator to indicate an exact match, and there is no LRSS string generated. In effect, the entire character string representing the component of the URI is replaced by one bit in the structure indicator designating a "copy" of the previous URI. This results in the possibility that an entire URI may be reduced to one byte if it is the same as the previous one (possibly triggered by a "reload" from a browser), or that several components may be reduced to one bit while others have LRSS strings. The strings for compressed pieces are concatenated after the structure indicator (402).

Figure 5:
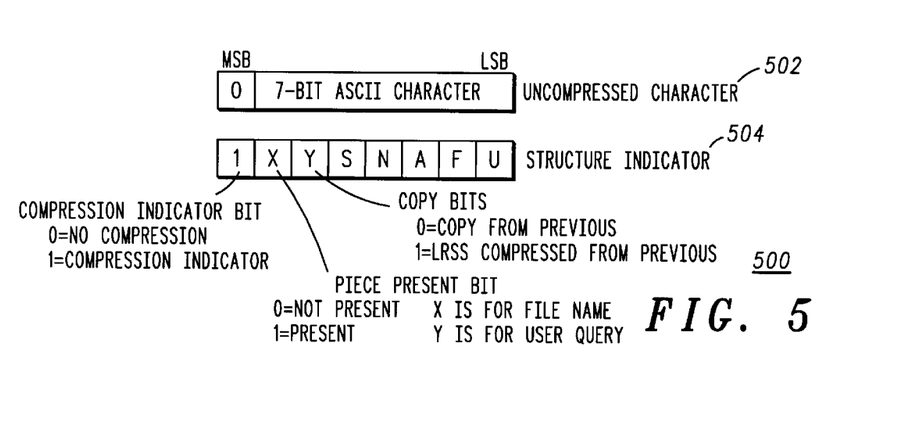
FIG. 5 is a block diagram showing an example of the format of a structure indicator and an uncompressed character in accordance with the present invention.

The structure indicator (402) provides a map of the compressed URI, i.e., what components are present. The format of the structure indicator (504) and an uncompressed character (502) is shown in FIG. 5, numeral 500. A URI from client-to-proxy contains at least the "sna" bits. The "x" and "y" bits are used to designate whether "f" and "u" are present. The "x" and "y" bits are needed for decompression and will be explained below. The "snafu" bits are used to tell whether these components are either completely identical to the previous URI or whether they have been compressed using LRSS. In the case where the component is identical, the bit is set to zero (0) and all characters are compressed down to one bit. In the case where only some of the characters are the same, the bit is set to one (1) and the piece is encoded using LRSS, i.e., count of matched characters from the left, followed by count of matched characters from the right, followed by uncompressed characters.

As mentioned before, the LRSS strings are concatenated after the structure indicator. A complication results when the last character of the uncompressed characters in an LRSS string has the MSB set to 1 (one). This would normally indicate a compression indicator to the decompression engine and a misinterpretation would occur. In order to eliminate this possibility, an escape byte is added to the end of the uncompressed characters of the LRSS string. The escape byte is chosen from the set of control CTL characters (ASCII 0-31). In this instantiation CTL-A (OxO1) is used. This escape mechanism is used only when the last uncompressed character has the MSB set to 1 (one). This escape mechanism technique is relatively safe since the augmented BNF for URIs designates CTL characters as invalid. Other methods may be used to delimit the compression indicators from the uncompressed characters, but such methods will not be as efficient.

Five exemplary URIs are set forth in Table 1:
http://www.ai.mit.edu/stocks/topstocks.html
http://www.ai.mit.edu/stocks/stock-graph.gif
http://www.ai.mit.edu/stocks/g/MOT.html
http://www.ai.mit.edu/stocks/price_graphs/MOT.gif
http://www.ai.mit.edu/stocks/vol_graphs/MOT.gif

TABLE 1

Using the five URIs found in TABLE 1, the method of the present invention for P-LRSS generates the following:
  current=http://www.ai.mit.edu/stocks/topstocks.html
  previous=<empty>
  current scheme=http:
  previous scheme=<empty>
  current network host=//www.ai.mit.edu
  previous network host=<empty>
  current absolute path=/stocks/
  previous absolute path=<empty>
  current file name=topstocks.html
  previous filename=<empty>
  current user query=<empty>
  previous user query=<empty>
  *****left-to-right=0
  *****right-to-left=0
  *****compressed URI=http://www.ai.mit.edu/stocks/topstocks.html
  *****savings=0 [1:1]
  current=http://www.ai.mit.edu/stocks/stock-graph.gif
  previous=http://www.ai.mit.edu/stocks/topstocks.html
  current scheme=http:
  previous scheme http:
  current network host=//www.ai.mit.edu
  previous network host=//www.ai.mit.edu
  current absolute path=/stocks/
  previous absolute path=/stocks/
  current file name=stock-graph.gif
  previous file name=topstocks.html
  current user query=<empty>
  previous user query=<empty>
  *****scheme=5 (all)
  *****network host=16 (all)
  *****absolute path=8 (all)
  *****compressed URI=<C2>stock-graph.gif
  *****savings=28 [2.75:1]
Note: <C2> is the hexadecimal representation of the encoded value of the structure indicator. The msb is set to 1 (one) to mark the character as a compression indicator. The "x" bit is set to 1 (one) to designate that the file name piece is present. The "y" is set to 0 (zero) to indicate that a user query is not present. The "s", "n", and "a" bits are set to 0 (zero) to indicate that the s, n, and a pieces are identical to the s, n, and a pieces of the previous URI. The "f" bit is set to 1 (one) to indicate that the file name field is compressed using LRSS. The value of the "u" bit is of not importance since the "y" bit is set such that the u component is not present.
  current=http://www.ai.mit.edu/stocks/g/MOT.html
  previous=http://www.ai.mit.edu/stocks/stock-graph.gif
  current scheme=http:
  previous scheme=http:
  current network host=//www.ai.mit.edu
  previous network host=//www.ai.mit.edu
  current absolute path=/stocks/g/
  previous absolute path=/stocks/
  current file name=MOT.html
  previous file name=stock-graph.gif
  current user query=<empty>
  previous user query=<empty>
  *****scheme=5 (all)
  *****network host=16 (all)
  *****absolute path=8
  compressed URI=<C6><88>g/MOT.html
  *****savings=27 [3.17:1]
  current=http://www.ai.mit.edu/stocks/price_graphs/MOT.gif
  previous=http://www.ai.mit.edu/stocks/g/MOT.html
  current scheme=http:
  previous scheme=http:
  current network host=//www.ai.mit.edu
  previous network host=//www.ai.mit.edu
  current absolute path=/stocks/price-graphs/
  previous absolute path=/stocks/g/
  current file name=MOT.gif
  previous file name=MOT.html
  current user query=<empty>
  previous user query=<empty>
  *****scheme=5 (all)
  *****network host=16 (all)
  *****absolute path=8
  *****file name=4
  *****compressed URI=<C6><88>price_graphs/<84>gif
  *****savings=30 [2.58:1]
  current=http://www.ai.mit.edu/stocks/vol-graphs/MOT.gif
  previous=http://www.ai.mit.edu/stocks/price_graphs/MOT.gif
  current scheme=http:
  previous scheme=http:
  current network host=//www.ai.mit.edu
  previous network host=//www.ai.mit.edu
  current absolute path=/stocks/vol-graphs/
  previous absolute path=/stocks/price-graphs/
  current file name=MOT.gif
  previous file name=MOT.gif
  current user query=<empty>
  previous user query=<empty>
  *****scheme=5 (all)
  *****network host=16 (all)
  *****absolute path=16
  *****file name=7
  *****compressed URI=<C4><88><C8>vol
  *****savings=41 [7.83:1]

The compression algorithm only requires that the sender and receiver keep track of the previously sent URI. This is a major advantage over LZW and other dictionary-based compression methods in that much less state information needs to be saved. The sender can generate an uncompressed URI at any time. This can be helpful for synchronizing the session.

Figure 6:
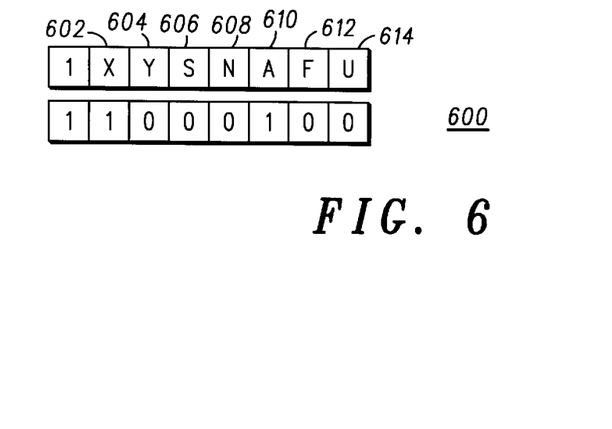
FIG. 6 is a block diagram of one embodiment of a structure indicator for the decompression in accordance with the present invention.

The decompression process reverses the compressed URI by copying the matched characters from previous to the uncompressed URI based on the structure indicator, the left-to-right and right-to-left compression indicators, and the intervening uncompressed characters in the current received URI. Consider the compressed URI from the last example above. The decompression proceeds as follows:

current=<C4><88><C8>vol previous=http://www.ai.mit.edu/stocks/price_graphs/MOT.gif The structure indicator for the decompression is shown in FIG. 6, numeral 600. The structure indicator value of<C4> is interpreted as x=file name is present (602), y=user query is not present (604), s=copy scheme from previous (606), n=copy network host from previous (608), a=absolute path is LRSS compressed (610), f=copy file name from previous (612), u=don't care set to zero (0) (614). u is a don't care because y=0 marks the user query as not being present in the URI.

s=copy scheme from previous
previous scheme=http:
uncompressed scheme=http:
n=copy network host from previous
previous network host=//www.ai.mit.edu
uncompressed network host=//www.ai.mit.edu
a=absolute path is LRSS compressed
previous absolute path=/stocks/price-graphs/
current absolute path=<88><c8>vol
uncompressed absolute path=/stocks/vol-graphs/

Note: The expansion of the LRSS string is described in CR00147M. Briefly,<88> indicates string substitution from the left (high-order 2 bits of first hex character) of 8 characters (remaining 6 bits), and<C8> indicates string substitution from the right of 8 characters. The characters "vol" are uncompressed and inserted between the left 8 characters and right 8 characters of the previous absolute path string.

f=copy file name from previous
previous file name=MOT.gif
uncompressed file name MOT.gif
u=don't care
previous user query=<empty>
uncompressed user query=<empty>.

The above description is for the case where there is a proxy between the client and server. In that case, the URI contains at least "sna". In the case where a client directly contacts a server, "s" and "n" are used to establish a connection from the client directly to the server. As such, "s" and "n" are no longer carried in the URI from client-to-server.

On the client side, the compression algorithm takes this into account by recognizing that the client is communicating directly to a server and that "s" and "n" were used to establish a session. The "s" and "n" bits in the structure indicator are now "don't care" bits and can be set to any value. In practice, zero (0) is chosen to indicate copy (the scheme and network host parts of the previous data structure will be <empty>, so copying them is safe).

On the server side, the decompression scheme will initialize the previous data structure to <empty> upon the establishment of a successful connection between client and server. This ensures that "s" and "n" are not included in the uncompressed URI since they are<empty>.

The setting and interpreting of the remainder of the structure indicator bits proceeds as described before.

Partitioned LRSS has a particular benefit over LRSS: Since the URI to be compressed is partitioned into several pieces, there is an opportunity to compress more of the characters. This is demonstrated in the following example.

current=http://guide-p.infoseek.com/WW/NS/Titles?qt=Outboard+Motors&col=WW previous=http://images.infoseek.com/images/nav_bar.gif current scheme=http:
previous scheme http:
current network host=//guide-p.infoseek.com
previous network host=//images.infoseek.com
current absolute path=/WW/NS/
previous absolute path=/images/
current file name=Titles
previous file name=nav_bar.gif
current user query=?qt=Outboard+Motors&col=WW
previous user query=<empty>
*scheme=5 (all)
*network host=15
*absolute path=0
*file name=0
*user query=0
*comp URI=<EF><82><CD>guide-p./WW/NS/Titles?qt=Outboard+Motors&col=WW
*savings=17 [1.35:1]

Upon application of LRSS to the same current and previous, the only part that would be compressed is "http://" since the left-to-right comparison ends when the first difference is encountered, and a right-to-left comparison yields nothing. This results in a savings of 6 characters. P-LRSS clearly provides an advantage.

The P-LRSS compression algorithm only requires that the sender and receiver keep track of the previously sent URI. The data structure for storing this URI is a bit more complex than that of LRSS due to the fact that the previous URI is stored in separate pieces. This data structure is still much smaller than the storage required by LZW and other dictionary-based compression methods. The execution time of P-LRSS is a bit more than LRSS due to the added complexity of parsing the URI, comparing more pieces, and generating a slightly more complex set of compression indicators.

Figure 3:
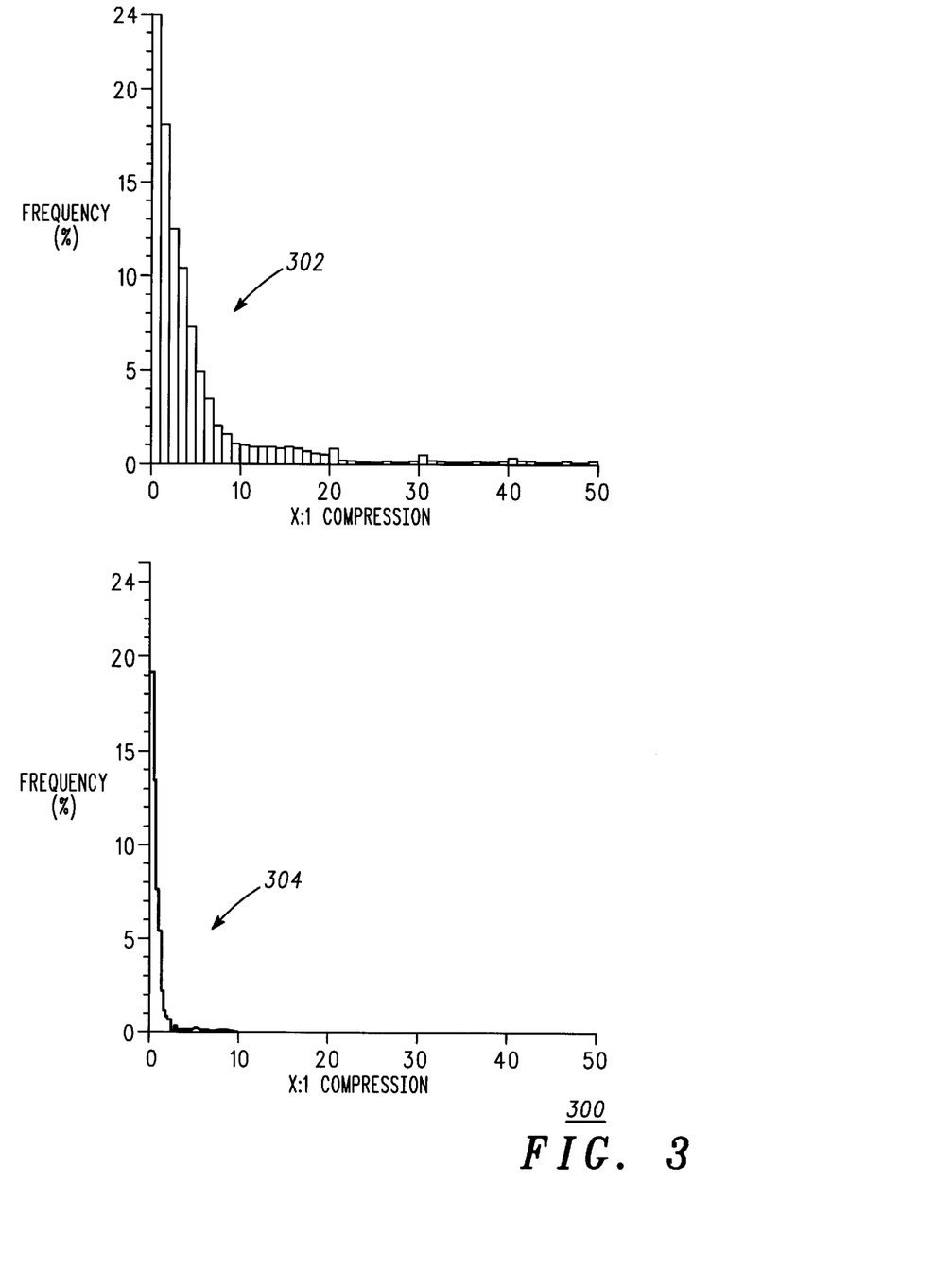
FIG. 3 illustrates two graphs for a large sample of URIs.

The results from running the compression scheme of the present invention on a sample of approximately 3 million are shown in FIG. 3, numeral 300. The top graph (302) shows the frequency in percent of the compression ratios from 1:1 to 50:1. The ratios are real numbers, such as 9.4:1. The bottom graph (304) shows the frequency in percent of all the compression ratios found in the sample. Note that 447:1 is the highest ratio found. The higher compression ratios result from relatively long URIs (greater than 1000 bytes) used in queries (searches, forms). This is an important observation since wireless users will use queries as part of wireless web access and large requests are costly for wireless networks in terms of capacity and cost per byte.

Figure 7:
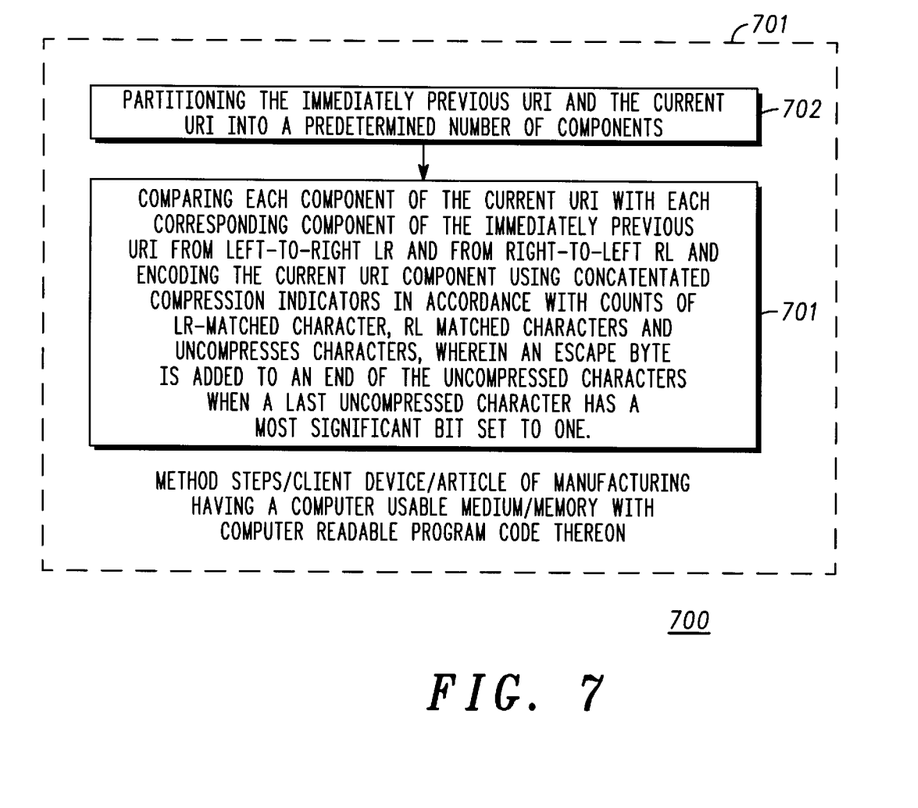
FIG. 7 is a flow chart showing one embodiment of steps of a method of compressing a URI in accordance with the present invention.

FIG. 7, numeral 700, is a flow chart showing one embodiment of steps of a method of compressing a URI in accordance with the present invention. The method includes the steps of: partitioning (702) the immediately previous URI and the current URI into a predetermined number of components; and comparing (704) each component of the current URI with each corresponding component of the immediately previous URI from left-to-right LR and from rightto-left RL and encoding the current URI components using concatenated compression indicators in accordance with counts of LR-matched characters, RL-matched characters and uncompressed characters, wherein an escape byte is added to an end of the uncompressed characters when a last uncompressed character has a most significant bit set to one. The predetermined number of components is typically 3, 4, 5, 6, or 7. However, any number of components may be used.

Comparing (704) each component of the current URI with each corresponding component of the immediately previous URI from left-to-right LR and from right-to-left RL and encoding the current URI in accordance with counts indicating LR- and RL-matched characters for the URI generally includes: (1) initializing a structure indicator for the current URI; (2) comparing a first component of the current URI with a first component of the immediately previous URI from left-to-right LR to determine a first number representing how many LR characters of a first group are LR-matched characters; (3) determining an encoded count of the first number of LR-matched characters of the first group; (4) comparing the first component of the current URI with the first component of the immediately previous URI from right-to-left RL to determine a second number representing how many characters of the first group are RL-matched characters; (5) determining an encoded count of the second number of RL-matched characters of the first group; (6) concatenating compression indicators in accordance with counts of the LR-matched characters, the RL matched characters and uncompressed characters, wherein an escape byte is added to an end of the uncompressed characters when a last uncompressed character has a most significant bit set to one; (7) repeating steps 2–6 for each of the predetermined number of components to encode the URI based on each of the numbers of LR-matched characters, the RL-matched characters and the uncompressed characters for the components of the URI; (8) prepending the structure indicator to the compressed components to complete the compressed URI; and (9) saving the components for further comparisons.

Where selected, the method may be implemented by a client device/article of manufacture having a computer usable medium/memory with computer readable program code thereon (701) for compressing a current universal resource identifier URI using an immediately previous URI. In this case, the computer readable program code includes the steps of the method as set forth above.

The client device/article of manufacture having a computer usable medium/memory with computer readable program code thereon (701) is typically a cellular phone, a phone, a pager, a personal digital assistant, or a computer.

Figure 8:
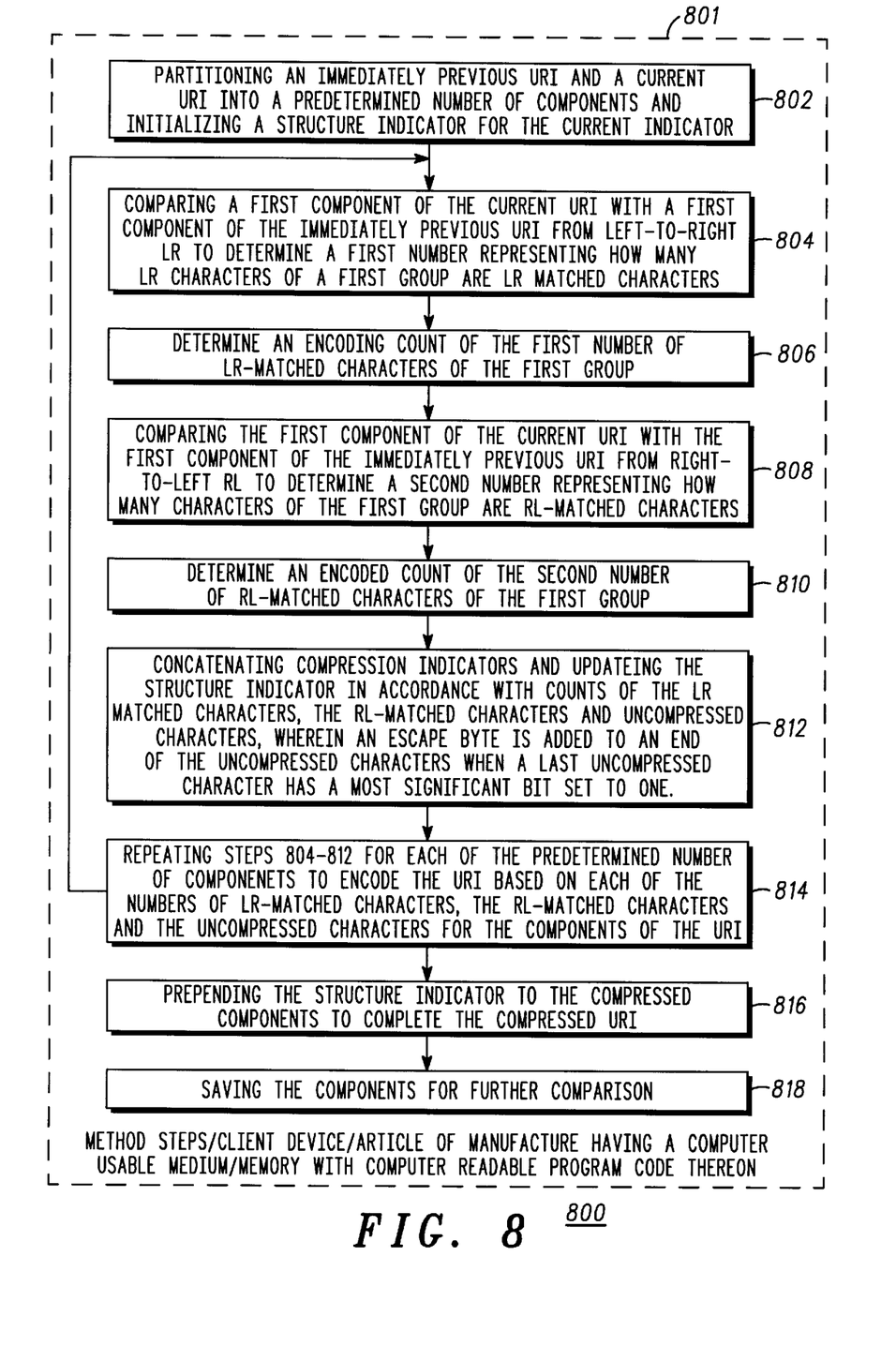
FIG. 8 is a flowchart illustrating another embodiment of steps in accordance with a method of compressing a URI in accordance with the present invention.

FIG. 8, numeral 800, is a flowchart illustrating another embodiment of steps in accordance with a method of compressing a URI in accordance with the present invention. The method includes the steps of: (1) partitioning (802) an immediately previous URI and a current URI into a predetermined number of components and initializing a structure indicator for the current URI; (2) comparing (804) a first component of the current URI with a first component of the immediately previous URI from left-to-right LR to determine a first number representing how many LR characters of a first group are LR-matched characters; (3) determining (806) an encoded count of the first number of LR-matched characters of the first group; (4) comparing (808) the first component of the current URI with the first component of the immediately previous URI from right-to-left RL to determine a second number representing how many characters of the first group are RL-matched characters; (5) determining (810) an encoded count of the second number of RL-matched characters of the first group; (6) concatenating (812) compression indicators and updating the structure indicator in accordance with counts of the LR-matched characters, the RL-matched characters and uncompressed characters, wherein an escape byte is added to an end of the uncompressed characters when a last uncompressed character has a most significant bit set to one; (7) repeating (814) steps 2–6 for each of the predetermined number of components to encode the URI based on each of the numbers of LR-matched characters, the RL-matched characters and the uncompressed characters for the components of the URI; (8) prepending (816) the structure indicator to the compressed components to complete the compressed URI; and (9) saving (818) the components for further comparisons.

Where selected, the method may be implemented by a client device/article of manufacture having a computer usable medium/memory with computer readable program code thereon (801) for compressing a current universal resource identifier URI using an immediately previous URI. In this case, the computer readable program code includes the steps of the method as set forth above.

The client device/article of manufacture having a computer usable medium/memory with computer readable program code thereon (801) is typically a cellular phone, a phone, a pager, a personal digital assistant, or a computer.

Figure 9:
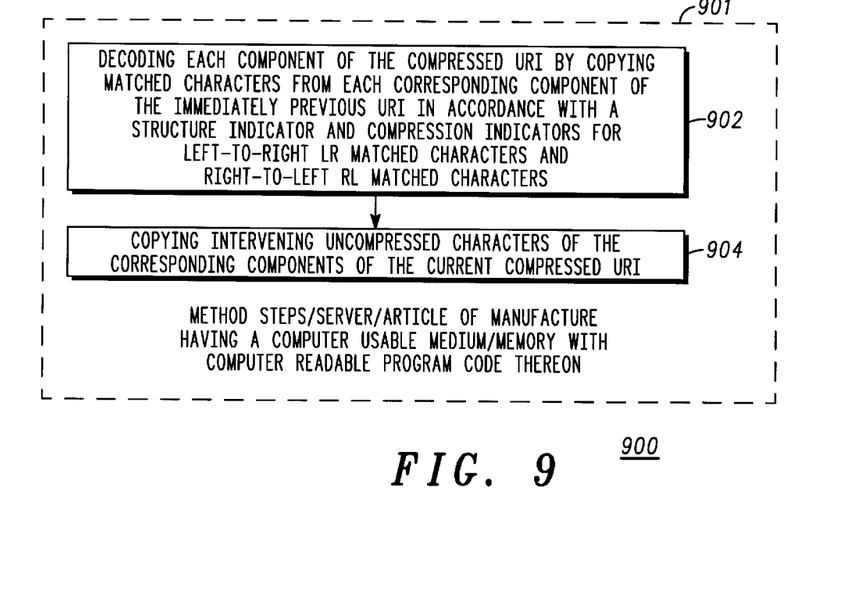
FIG. 9 is a flow chart showing one embodiment of steps in accordance with a method for decompressing a compressed URI using an immediately previous URI in accordance with the present invention.

FIG. 9, numeral 900, is a flow chart showing one embodiment of steps in accordance with a method for decompressing a compressed URI using an immediately previous URI in accordance with the present invention where the URI has been partitioned into a plurality of components before compression. The method includes the steps of: A) decoding (902) each component of the compressed URI by copying matched characters from each corresponding component of the immediately previous URI in accordance with a structure indicator and compression indicators for left-to-right LR matched characters and right-to-left RL matched characters; and copying (904) intervening uncompressed characters of the corresponding component of the current compressed URI. The method of decompression may be implemented by, for example, a server/article of manufacture having a computer usable medium/memory with computer readable program code thereon (901) for decompressing the URI using an immediately previous URI in accordance with the present invention. The computer readable program code typically implements the steps of decompression set forth above.

Figure 10:
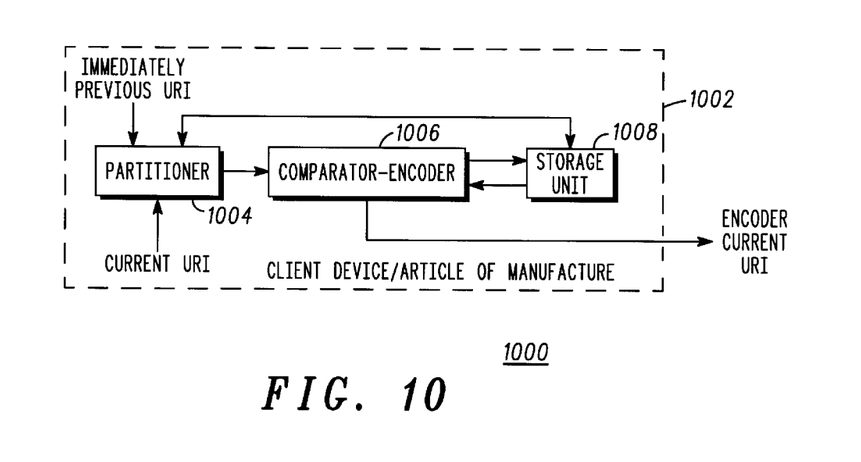
FIG. 10 is a block diagram of one implementation of a client device/article of manufacture for compressing a current universal resource identifier URI using an immediately previous URI in accordance with the present invention.

FIG. 10, numeral 1000, is a block diagram of one implementation of a client device/article of manufacture for compressing a current universal resource identifier URI using an immediately previous URI in accordance with the present invention. The client device/article of manufacture (1002) includes a partitioner (1004), a comparator-encoder (1006), and a storage unit (1008). The partitioner (1004) is coupled to receive the current URI and the immediately previous URI and is used for partitioning the immediately previous URI and the current URI into a predetermined number of components. The comparator-encoder (1006) is coupled to the partitioner (1004) and is used for comparing each component of the current URI with each corresponding component of the immediately previous URI from left-to-right LR and from right-to-left RL and encoding the current URI using compression indicators in accordance with counts of LR-matched characters, RL-matched characters and uncompressed characters for the URI. The storage unit (1008) is coupled to the comparator-encoder (1006) and the partitioner (1004) and is used for replicating a current register into a previous register. The client device/article of manufacture (1002) is typically a cellular phone, a phone, a pager, a personal digital assistant, or a computer.

Figure 11:
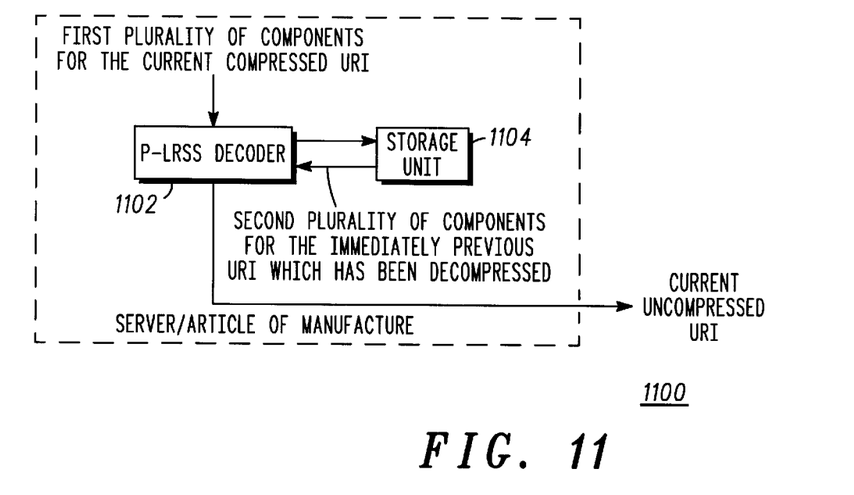
FIG. 11 is a block diagram of a server/article of manufacture for decompressing, in accordance with the present invention, a compressed universal resource identifier URI using an immediately previous compressed URI.

FIG. 11, numeral 1100, is a block diagram of a server/article of manufacture for decompressing a current compressed universal resource identifier URI using an immediately previous URI which has been decompressed, where the current compressed URI has been partitioned into a plurality of components before compression. The server/article of manufacture typically includes a partitioned left/right string substitution (P-LRSS) decoder (1102) and a storage unit (1104). The P-LRSS decoder (1102) is coupled to receive a first plurality of components for the current compressed URI and a second plurality of components for the immediately previous URI which has been decompressed and is used for decoding each component of the first plurality of components for the current compressed URI by copying matched characters from each corresponding component of the second plurality of components of the immediately previous URI in accordance with a structure indicator and compression indicators for left-to-right LR matched characters and right-to-left RL matched characters and copying intervening uncompressed characters of each component of the second plurality of components of characters of the immediately previous URI into each corresponding component of a current uncompressed URI. The storage unit (1104) is coupled to the P-LRSS decoder (1102) and is used for copying a current register into a previous register.

Figure 12:
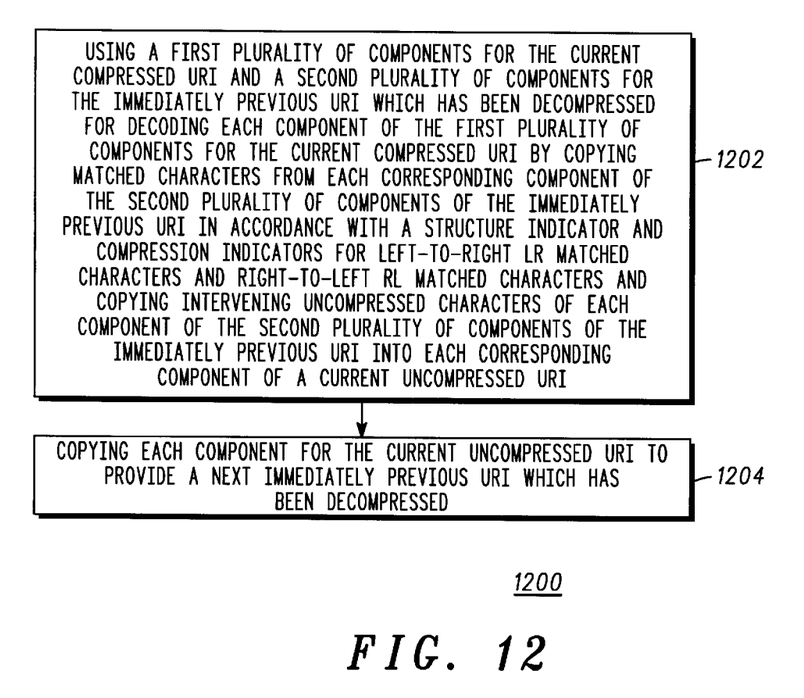
FIG. 12 is a flow chart showing another embodiment of steps in accordance with a method for decompressing a compressed URI using an immediately previous URI in accordance with the present invention.

Thus, one embodiment of the method for decompressing a current compressed universal resource identifier URI using an immediately previous URI which has been decompressed, where the current compressed URI has been partitioned into a plurality of components before compression may also be described by the following steps (which are set forth in FIG. 12, numeral 1200): A) using (1202) a first plurality of components for the current compressed URI and a second plurality of components for the immediately previous URI which has been decompressed for decoding each component of the first plurality of components for the current compressed URI by copying matched characters from each corresponding component of the second plurality of components of the immediately previous URI in accordance with a structure indicator and compression indicators for left-to-right LR matched characters and right-to-left RL matched characters and copying intervening uncompressed characters of each component of the second plurality of components of the immediately previous URI into each corresponding component of a current uncompressed URI; and B) copying (1204) each component for the current uncompressed URI to provide a next immediately previous URI which has been decompressed.

The present invention may be implemented, as described above in more detail, using a proxy between a client and a server, or alternatively, in the case where the client directly contacts a server. The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

We claim:

1. A method for compressing a current universal resource identifier URI using an immediately previous URI, comprising the steps of:

partitioning the immediately previous URI and the current URI into a predetermined number of components; and comparing each component of the current URI with each corresponding component of the immediately previous URI from left-to-right LR and from right-to-left RL and encoding the current URI components using concatenated compression indicators in accordance with counts of LR-matched characters, RL matched characters and uncompressed characters, wherein an escape byte is added to an end of the uncompressed characters when a last uncompressed character has a most significant bit set to one.

2. The method of claim 1 wherein the predetermined number of components is one of: 3, 4, 5, 6, and 7.

3. The method of claim 1 wherein comparing each component of the current URI with each corresponding component of the immediately previous URI from left-to-right LR and from right-to-left RL and encoding the current URI in accordance with counts indicating LR and RL matched characters for the URI includes:

A) initializing a structure indicator for the current URI;

B) comparing a first component of the current URI with a first component of the immediately previous URI from left-to-right LR to determine a first number representing how many LR characters of a first group are LR-matched characters;

C) determining an encoded count of the first number of LR-matched characters of the first group;

D) comparing the first component of the current URI with the first component of the immediately previous URI from right-to-left RL to determine a second number representing how many characters of the first group are RL-matched characters;

E) determining an encoded count of the second number of RL-matched characters of the first group;

F) concatenating compression indicators and updating the structure indicator in accordance with counts of the LR-matched characters, the RL matched characters and uncompressed characters, wherein an escape byte is added to an end of the uncompressed characters when a last uncompressed character has a most significant bit set to one;

G) repeating steps B–F for each of the predetermined number of components to encode the URI based on each of the numbers of LR-matched characters, the RL-matched characters and the uncompressed characters for the components of the URI;

H) prepending the structure indicator to the compressed components to complete the compressed URI; and I) saving the components for further comparisons.

4. A method for compressing a universal resource identifier URI using an immediately previous URI, comprising the steps of:

A) partitioning an immediately previous URI and a current URI into a predetermined number of components and initializing a structure indicator for the current URI;

B) comparing a first component of the current URI with a first component of the immediately previous URI from left-to-right LR to determine a first number representing how many LR characters of a first group are LR-matched characters;

C) determining an encoded count of the first number of LR-matched characters of the first group;

D) comparing the first component of the current URI with the first component of the immediately previous URI from right-to-left RL to determine a second number representing how many characters of the first group are RL-matched characters;

E) determining an encoded count of the second number of RL-matched characters of the first group;

F) concatenating compression indicators and updating the structure indicator in accordance with counts of the LR-matched characters, the RL matched characters and uncompressed characters, wherein an escape byte is added to an end of the uncompressed characters when a last uncompressed character has a most significant bit set to one;

G) repeating steps B–F for each of the predetermined number of components to encode the URI based on each of the numbers of LR-matched characters, the RL-matched characters and the uncompressed characters for the components of the URI;

H) prepending the structure indicator to the compressed components to complete the compressed URI; and I) saving the components for further comparisons.

5. A method for decompressing a current compressed universal resource identifier URI using an immediately previous URI where the URI has been partitioned into a plurality of components before compression, comprising the steps of:

decoding each component of the compressed URI by copying matched characters from each corresponding component of the immediately previous URI in accordance with a structure indicator and compression indicators for left-to-right LR matched characters and right-to-left RL matched characters; and copying intervening uncompressed characters of the corresponding component of the current compressed URI.

6. A client device/article of manufacture having a computer usable medium/memory with computer readable program code thereon for compressing a current universal resource identifier URI using an immediately previous URI, wherein the computer readable program code is implemented by the steps of:

partitioning the immediately previous URI and the current URI into a predetermined number of components; and comparing each component of the current URI with each corresponding component of the immediately previous URI from left-to-right LR and from right-to-left RL and encoding the current URI using concatenated compression indicators in accordance with counts of LR-matched characters, RL matched characters and uncompressed characters, wherein an escape byte is added to an end of the uncompressed characters when a last uncompressed character has a most significant bit set to one.

7. The client device/article of manufacture having a computer usable medium/memory with computer readable program code thereon of claim 6 wherein the predetermined number of components is one of: 3, 4, 5, 6, and 7.

8. The client device/article of manufacture having a computer usable medium/memory with computer readable program code thereon of claim 6 wherein comparing each component of the current URI with each corresponding component of the immediately previous URI from left-to-right LR and from right-to-left RL and encoding the current URI in accordance with counts indicating LR and RL matched characters for the URI includes:

A) initializing a structure indicator for the current URI;

B) comparing a first component of the current URI with a first component of the immediately previous URI from left-to-right LR to determine a first number representing how many LR characters of a first group are LR-matched characters;

C) determining an encoded count of the first number of LR-matched characters of the first group;

D) comparing the first component of the current URI with the first component of the immediately previous URI from right-to-left RL to determine a second number representing how many characters of the first group are RL-matched characters;

E) determining an encoded count of the second number of RL-matched characters of the first group;

F) concatenating compression indicators and updating the structure indicator in accordance with counts of the LR-matched characters, the RL matched characters and uncompressed characters, wherein an escape byte is added to an end of the uncompressed characters when a last uncompressed character has a most significant bit set to one;

G) repeating steps B–F for each of the predetermined number of components to encode the URI based on each of the numbers of LR-matched characters, the RL-matched characters and the uncompressed characters for the components of the URI;

H) prepending the structure indicator to the compressed components to complete the compressed URI; and I) saving the components for further comparisons.

9. The client device/article of manufacture having a computer usable medium/memory with computer readable program code thereon of claim 6 wherein the client device/article of manufacture having a computer usable medium/memory with computer readable program code thereon is one of:

A) a cellular phone;

B) a phone;

C) a pager;

D) a personal digital assistant; and

E) a computer.

10. A client device/article of manufacture for compressing a current universal resource identifier URI using an immediately previous URI where the URI has been partitioned into a plurality of components of characters before compression, comprising:

A) a partitioner, coupled to receive the current URI and the immediately previous URI, for partitioning the immediately previous URI and the current URI into a predetermined number of components;

B) a comparator-encoder, coupled to the partitioner, for receiving and comparing each component of the current URI with each corresponding component of the immediately previous URI from left-to-right LR and from right-to-left RL and encoding the current URI using compression indicators in accordance with counts of LR- matched characters, RL-matched characters and uncompressed characters for the URI; and C) a storage unit, coupled to the comparator-encoder and the partitioner, and is used for replicating a current register into a previous register.

11. The client device/article of manufacture of claim 10, wherein the client device/article of manufacture is one of:

A) a cellular phone;

B) a phone;

C) a pager;

D) a personal digital assistant; and

E) a computer.

12. A server/article of manufacture having a computer usable medium/memory with computer readable program code thereon for decompressing a universal resource identifier URI using an immediately previous URI, where the URI to be decompressed has been partitioned into a plurality of components of characters, wherein the computer readable program code is implemented by the steps of:

decoding each component of the compressed URI by copying matched characters from each corresponding component of the immediately previous URI in accordance with a structure indicator and compression indicators for left-to-right LR matched characters and right-to-left RL matched characters; and copying intervening uncompressed characters of the corresponding component of the current compressed URI, decoding the compressed URI by copying matched characters from the immediately previous URI in accordance with a structure indicator and compression indicators for left-to-right LR matched characters and right-to-left RL matched characters; and copying each component of the decompressed URI from a current register into a previous register.

13. A server/article of manufacture for decompressing a current compressed universal resource identifier URI using an immediately previous URI which has been decompressed, where the current compressed URI has been partitioned into a plurality of components of characters before compression, comprising:

A) a partitioned left/right string substitution P-LRSS decoder, coupled to receive a first plurality of components of characters for the current compressed URI and a second plurality of components for the immediately previous URI which has been decompressed and is used for decoding each component of the first plurality of components of characters for the current compressed URI by copying matched characters from each corresponding component of the second plurality of components of characters of the immediately previous URI in accordance with a structure indicator and compression indicators for left-to-right LR matched characters and right-to-left RL matched characters and copying intervening uncompressed characters of each component of the second plurality of components of characters of the immediately previous URI into each corresponding component of a current uncompressed URI; and B) a storage unit, coupled to the P-LRSS decoder, for copying a current register into a previous register.

14. A method for decompressing a current compressed universal resource identifier URI using an immediately previous URI which has been decompressed, where the current compressed URI has been partitioned into a plurality of components of characters before compression, comprising the steps of:

A) using a first plurality of components of characters for the current compressed URI and a second plurality of components for the immediately previous URI which has been decompressed for decoding each component of the first plurality of components of characters for the current compressed URI by copying matched characters from each corresponding component of the second plurality of components of characters of the immediately previous URI in accordance with a structure indicator and compression indicators for left-to-right LR matched characters and right-to-left RL matched characters and copying intervening uncompressed characters of each component of the second plurality of components of characters of the immediately previous URI into each corresponding component of a current uncompressed URI; and B) copying each component for the current uncompressed URI to provide a next immediately previous URI which has been decompressed.

15. A client device/article of manufacture having a computer usable medium/memory with computer readable program code thereon for compressing a current universal resource identifier URI using an immediately previous URI, wherein the computer readable program code is implemented by the steps of:

A) partitioning an immediately previous URI and a current URI into a predetermined number of components and initializing a structure indicator for the current URI;

B) comparing a first component of the current URI with a first component of the immediately previous URI from left-to-right LR to determine a first number representing how many LR characters of a first group are LR-matched characters;

C) determining an encoded count of the first number of LR-matched characters of the first group;

D) comparing the first component of the current URI with the first component of the immediately previous URI from right-to-left RL to determine a second number representing how many characters of the first group are RL-matched characters;

E) determining an encoded count of the second number of RL-matched characters of the first group;

F) concatenating compression indicators and updating the structure indicator in accordance with counts of the LR-matched characters, the RL matched characters and uncompressed characters, wherein an escape byte is added to an end of the uncompressed characters when a last uncompressed character has a most significant bit set to one;

G) repeating steps B–F for each of the predetermined number of components to encode the URI based on each of the numbers of LR-matched characters, the RL-matched characters and the uncompressed characters for the components of the URI;

H) prepending the structure indicator to the compressed components to complete the compressed URI; and I) saving the components for further comparisons.

16. The client device/article of manufacture having a computer usable medium/memory with computer readable program code thereon of claim 15 wherein the client device/article of manufacture having a computer usable medium/memory with computer readable program code thereon is one of:

A) a cellular phone;

B) a phone;

C) a pager;

D) a personal digital assistant; and E) a computer.

* * * * *